(12) United States Patent
Aklufi et al.

(10) Patent No.: US 6,176,922 B1
(45) Date of Patent: Jan. 23, 2001

(54) METHOD FOR IMPROVING CRYSTALLINE THIN FILMS WITH A CONTOURED BEAM PULSED LASER

(75) Inventors: Monti E. Aklufi; Stephen D. Russell, both of San Diego, CA (US)

(73) Assignee: The United States of America as represented by the Secretary of the Navy, Washington, DC (US)

(*) Notice: Under 35 U.S.C. 154(b), the term of this patent shall be extended for 0 days.

(21) Appl. No.: 09/413,707

(22) Filed: Oct. 6, 1999

Related U.S. Application Data

(62) Division of application No. 08/934,037, filed on Sep. 19, 1997, now Pat. No. 6,014,944.

(51) Int. Cl.⁷ .................................................. C30B 1/06
(52) U.S. Cl. ..................... 117/4; 117/8; 117/9; 117/10; 117/904
(58) Field of Search .................... 117/4, 7, 8, 9, 117/10, 904

(56) References Cited

U.S. PATENT DOCUMENTS

| | | | |
|---|---|---|---|
| 4,249,141 | * | 2/1981 | Brown et al. . |
| 4,707,217 | * | 11/1987 | Aklufi . |
| 4,733,944 | * | 3/1988 | Fahlen et al. . |
| 4,799,454 | * | 1/1989 | Ito . |
| 4,932,747 | * | 6/1990 | Russell et al. . |
| 5,174,826 | * | 12/1992 | Mannava et al. . |
| 5,223,080 | * | 6/1993 | Ohta et al. . |
| 5,395,481 | * | 3/1995 | McCarthy . |
| 5,424,230 | * | 6/1995 | Wakai . |
| 5,425,860 | * | 6/1995 | Truher et al. . |
| 5,529,951 | * | 6/1996 | Noguchi et al. . |

\* cited by examiner

Primary Examiner—Robert Kunemund
(74) Attorney, Agent, or Firm—Harvey Fendelman; Michael A. Kagan; Eric James Whitesell

(57) ABSTRACT

A method is presented for crystallizing a thin film on a substrate by generating a beam of pulsed optical energy, countouring the intensity profile of the beam, and illuminating the thin film with the beam to crystallize the thin film into a single crystal lattice structure.

19 Claims, 5 Drawing Sheets

METHOD FOR IMPROVING CRYSTALLINE THIN FILMS WITH A CONTOURED BEAM PULSED LASER

CROSS-REFERENCE TO RELATED APPLICATIONS

This is a divisional application under 37 CFR 1.53 of patent application "METHOD AND APPARATUS FOR IMPROVING CRYSTALLINE THIN FILMS WITH A CONTOURED BEAM PULSED LASER", Ser. No. 08/934, 037 filed on Sep. 19, 1997 now U.S. Pat. No. 6,014,944.

LICENSING INFORMATION

The invention described below is assigned to the United States Government and is available for licensing commercially. Technical and licensing inquiries may be directed to Harvey Fendelman, Legal Counsel For Patents, NCCOSC RDTE DIV CODE 0012, 53510 Silvergate Avenue Room 103, San Diego, Calif. 92152-5765; telephone no. (619) 553-3818; fax no. (619) 553-3821.

BACKGROUND OF THE INVENTION

The present invention relates to the fabrication of thin crystalline films on temperature sensitive substrates by laser irradiation. More specifically, but without limitation thereto, the present invention relates to the fabrication of a thin monocrystalline silicon film on a substrate using a pulsed excimer laser and a unique arrangement of optics to control the temperature budget.

Current flat panel display technology uses liquid crystal displays integrated with thin film transistors (TFT's). Almost all active matrix LCD's comprise amorphous silicon on glass. For the next generation of active matrix LCD's, polycrystalline silicon is being considered instead of amorphous silicon. The performance of polycrystalline silicon TFT's could be further improved by improving the crystalline structure of silicon films. Fabrication of device quality semiconductor films on amorphous substrates such as glass is also important for low cost, disposable electronics applications including non-planar or curved surfaces and flexible substrates. CW lasers have been used with a contoured beam for improving the crystallinity of silicon films on amorphous surfaces, but this approach does not accommodate current needs for large area, rapid processing, and low thermal budget processing.

U.S. Pat. No. 4,707,217 issued on Nov. 17, 1987 to Aklufi teaches that single crystal growth on amorphous or polycrystalline substrates is thermodynamically favored under specific conditions, and that single crystal growth may be obtained by maintaining the angle defined by the trailing liquid edge of the scanned hot zone smaller than the included angle defined by the intersection of the preferred growth planes of the crystal (col. 1, ln 57–65). Aklufi further teaches establishing a layer of a semiconductor material such as silicon or any other material that has a crystalline state, and then continuously scanning the surface of the material with a wedge-shaped heat-zone created by a heat source such that the angle of the heat source is less than the angle defined by the intersection of the preferred growth planes. A portion of the material is melted along the apex of the scan and solidifies along the trailing edge of the scan into single crystal material.

A continuing need exists for a low thermal budget process to improve crystallinity of silicon on amorphous surfaces that may be non-planar and flexible, and to provide lateral crystal growth (DLC) in thin films.

SUMMARY OF THE INVENTION

The method for crystallizing a thin film on a substrate of the present invention are directed to overcoming the problems described above, and may provide further related advantages. No embodiment of the present invention described herein shall preclude other embodiments or advantages that may exist or become obvious to those skilled in the art.

A process for crystallizing a thin film on a substrate of the present invention comprises the steps of generating a beam of pulsed optical energy, transforming the intensity profile of the beam of pulsed optical energy to a contoured intensity profile, and illuminating the thin film with the beam to crystallize the thin film.

An advantage of the process for crystallizing a thin film on a substrate of the present invention is that only a single laser beam source is required, simplifying the apparatus.

Another advantage is that the process may be used in large area processing applications with reduced sample processing time.

Yet another advantage is that the thermal budget per sample is reduced.

Still another advantage is that crystalline silicon films may be formed on non-planar and flexible substrates.

The features and advantages summarized above in addition to other aspects of the present invention will become more apparent from the description, presented in conjunction with the following drawings.

DESCRIPTION OF THE INVENTION

The following description is presented solely for the purpose of disclosing how the present invention may be made and used. The scope of the invention is defined by the claims.

Figure 1:
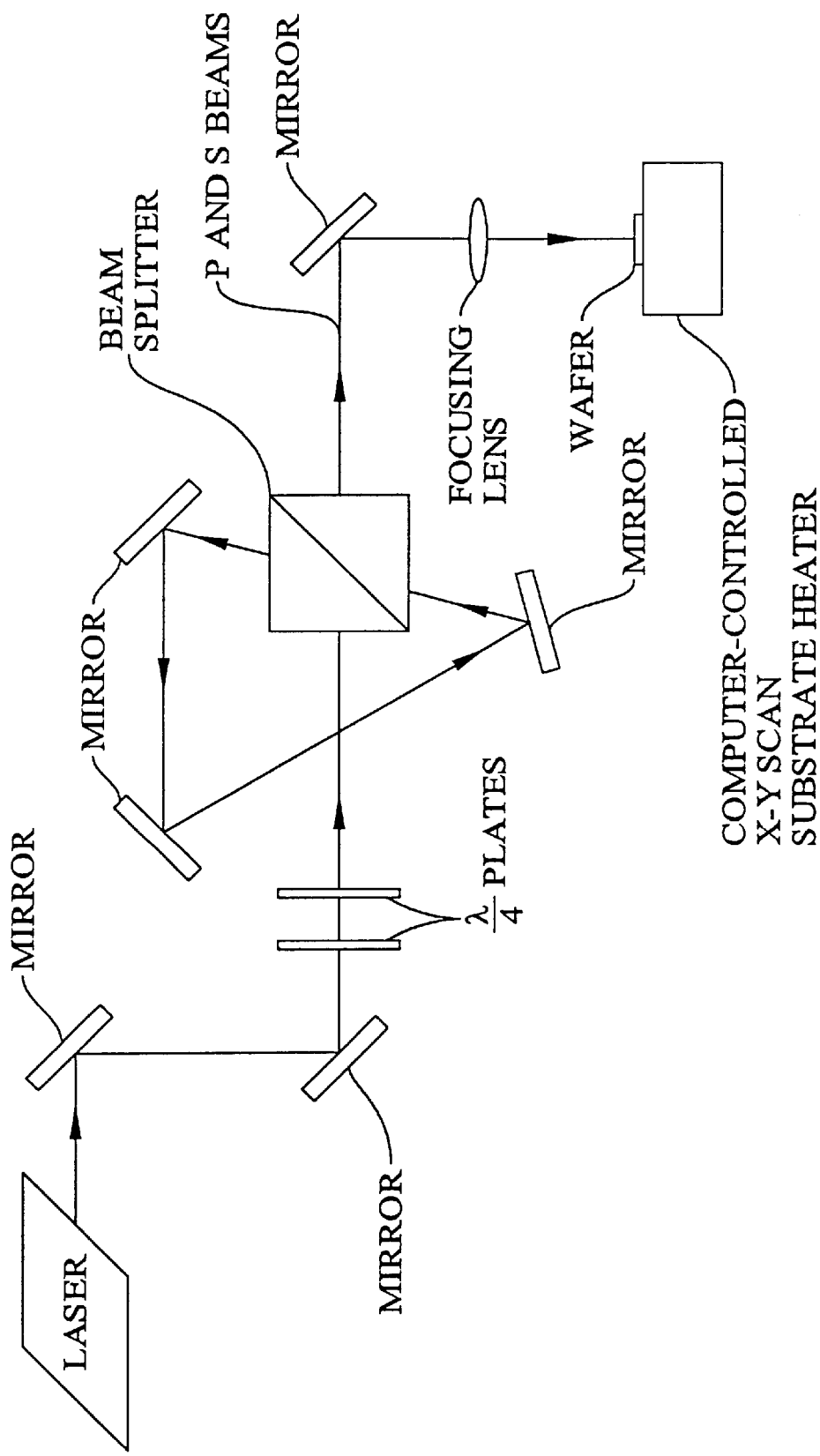
FIG. 1 is a diagram of an annealing apparatus of the prior art for generating a contoured laser beam.
Figure 2:
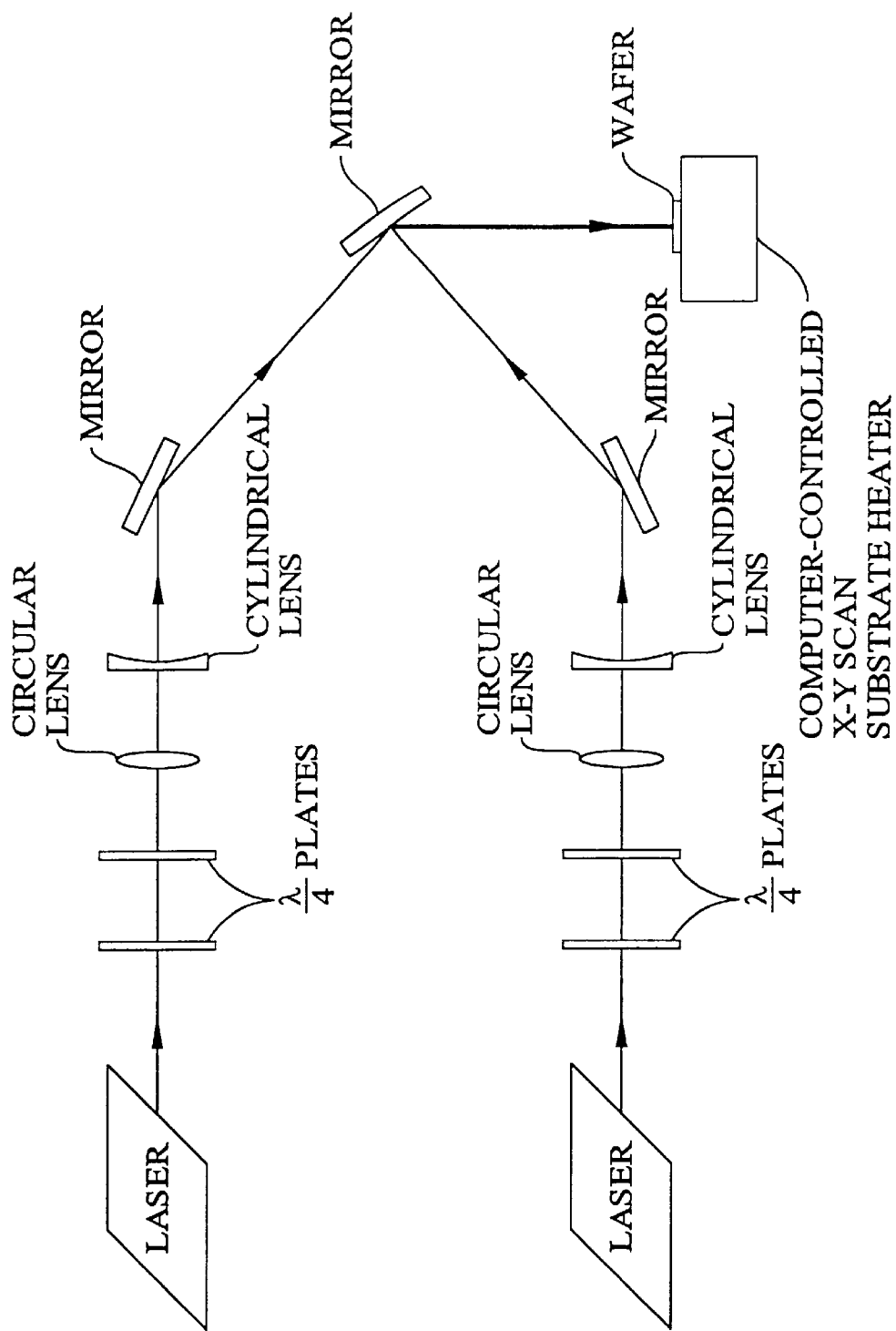
FIG. 2 is a diagram of an annealing apparatus of the prior art for generating a contoured laser beam using two lasers.

FIG. 1 of the prior art shows splitting a scanned laser beam and recombining cross-polarized beams onto a planar sample (see also description beginning in col 5, ln 19, U.S. Pat. 4,707,217 issued on Nov. 17, 1987 to Aklufi and incorporated herein by reference thereto). FIG. 2 of the prior art shows two scanned laser beams combined to form a wedge-shaped beam (col 6, ln 16–55).

Figure 3:
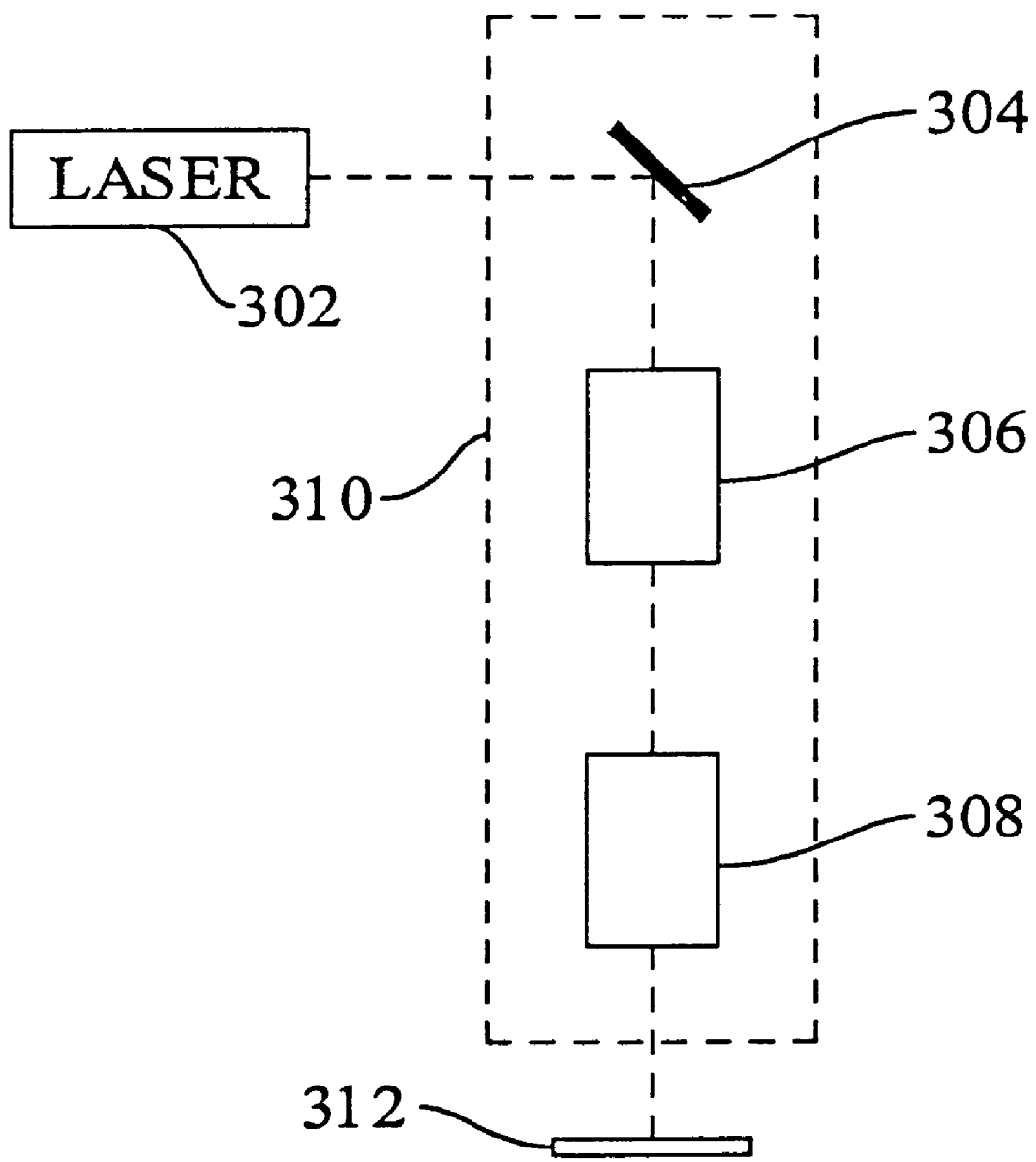
FIG. 3 is a diagram of an annealing apparatus for practicing the present invention.

FIG. 3 is a diagram of one embodiment of an annealing apparatus 30 for practicing the present invention comprising an excimer laser 302, beam steering optics 304, optional beam homogenizing optics 306, and beam contouring optics 308 arranged along an optical path 310. Excimer laser 302 provides pulsed optical energy having a wavelength in the range of about 157 nm to 351 nm, and typically about 248 nm. The laser pulses have a duration in the range of about 10 nsec to 1 msec, and typically about 23 nsec. The pulse repetition rate and number of pulses may be varied, and typical values for minimizing substrate heating are 1 pulse at 1 Hz. Higher repetition rates and numbers of pulses may be used in the same sample location for successive recrystallization. Laser fluence incident on sample 312 may be up to but not exceeding the material ablation threshold, which is about 2.2 J/cm$^2$ for single crystal silicon. For thin silicon films the laser fluence for ablation is less than bulk silicon and is dependent in part on the thickness of the film and the substrate material configuration.

Beam steering optics 304 comprises optical elements positioned at one or more locations along optical path 310. By way of example, beam steering optics 304 may be a single dielectrically coated turning mirror as shown with maximum reflectivity at 45 degrees incidence at the laser operating wavelength.

Beam homogenizing optics 306 comprises optical elements positioned at one or more locations along optical path 310 for homogenizing the pulsed laser beam to obtain a spatially uniform intensity profile. An example of suitable beam homogenizing optics is described in U.S. Pat. No. 4,932,747 issued on Jun. 12, 1990 to Russell et al and incorporated herein by reference thereto. Another beam homogenizer is described in U.S. Pat. No. 4,733,944 titled. "Optical Beam Integration System" issued to Fahlen and incorporated herein by reference thereto. Alternatively, another embodiment of the present invention omits beam homogenizing optics 306 from optical path 310.

Figure 5:
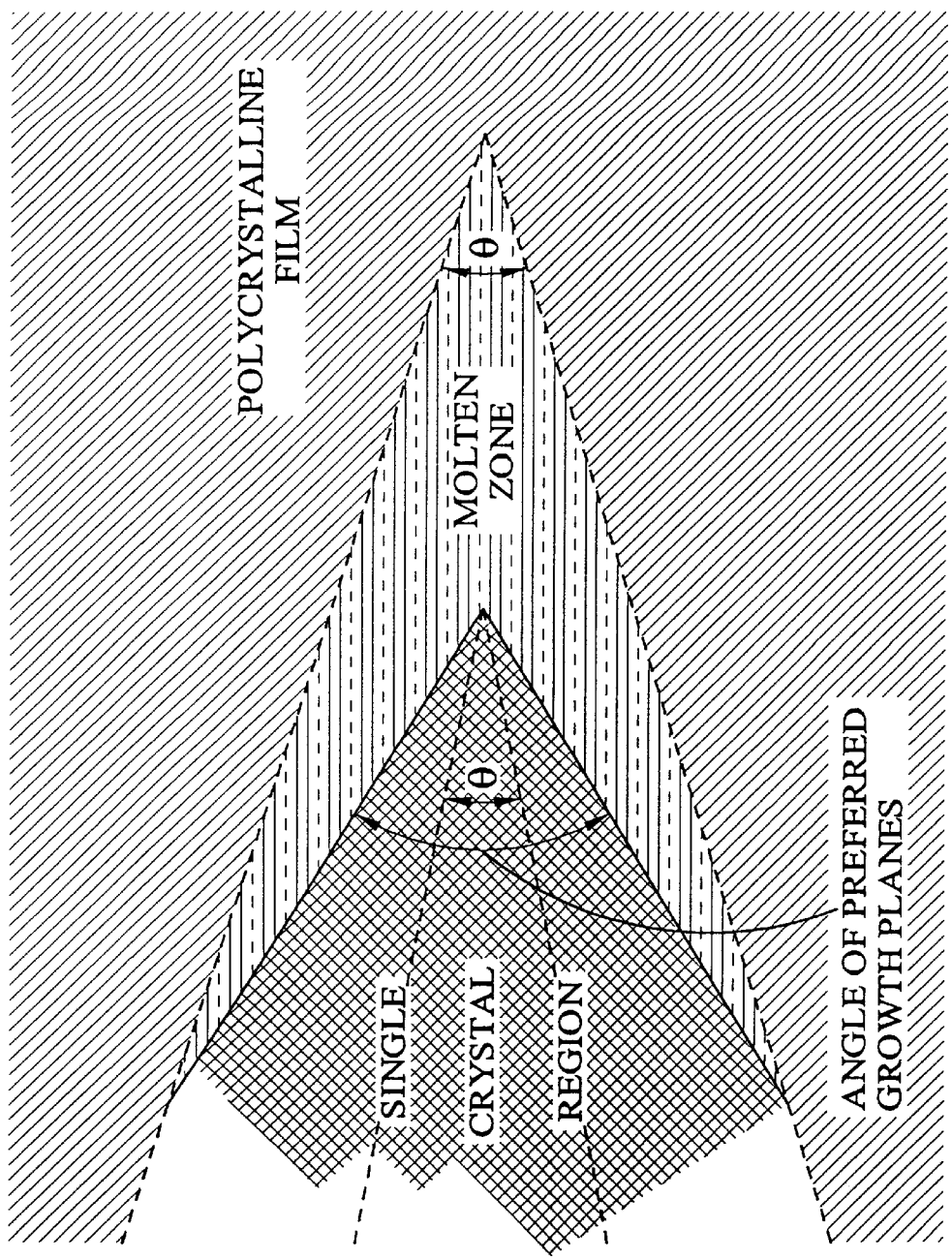
FIG. 5 is a diagram of a thin film exposed to an optically homogenized pulsed laser beam having a contoured intensity profile.

Beam contouring optics 308 comprises a plurality of optical elements positioned at one or more locations along optical path 310 to obtain a contoured intensity profile. By way of example, beam contouring optics may be a linearly graded beamsplitter (not shown). Another example is a linearly graded neutral density filter (not shown), which transforms a spatially uniform intensity profile into a contoured, linearly varying intensity profile. Non-linear graded intensity profiles may also be used to practice the present invention. Also, the intensity gradient may be aligned perpendicularly or at another angle with respect to the direction of crystallization. Still another example of beam contouring optics 308 is a neutral density filter (not shown) having linearly graded portions positioned at an angle less than or equal to the included angle defined by the chevron-shaped intersection of the preferred growth planes as shown in FIG. 5. An alignment device (not shown) may be used to align the contoured intensity profile with crystal planes of thin film sample 312, which may have a planar, curved, or flexible surface.

Figure 4:
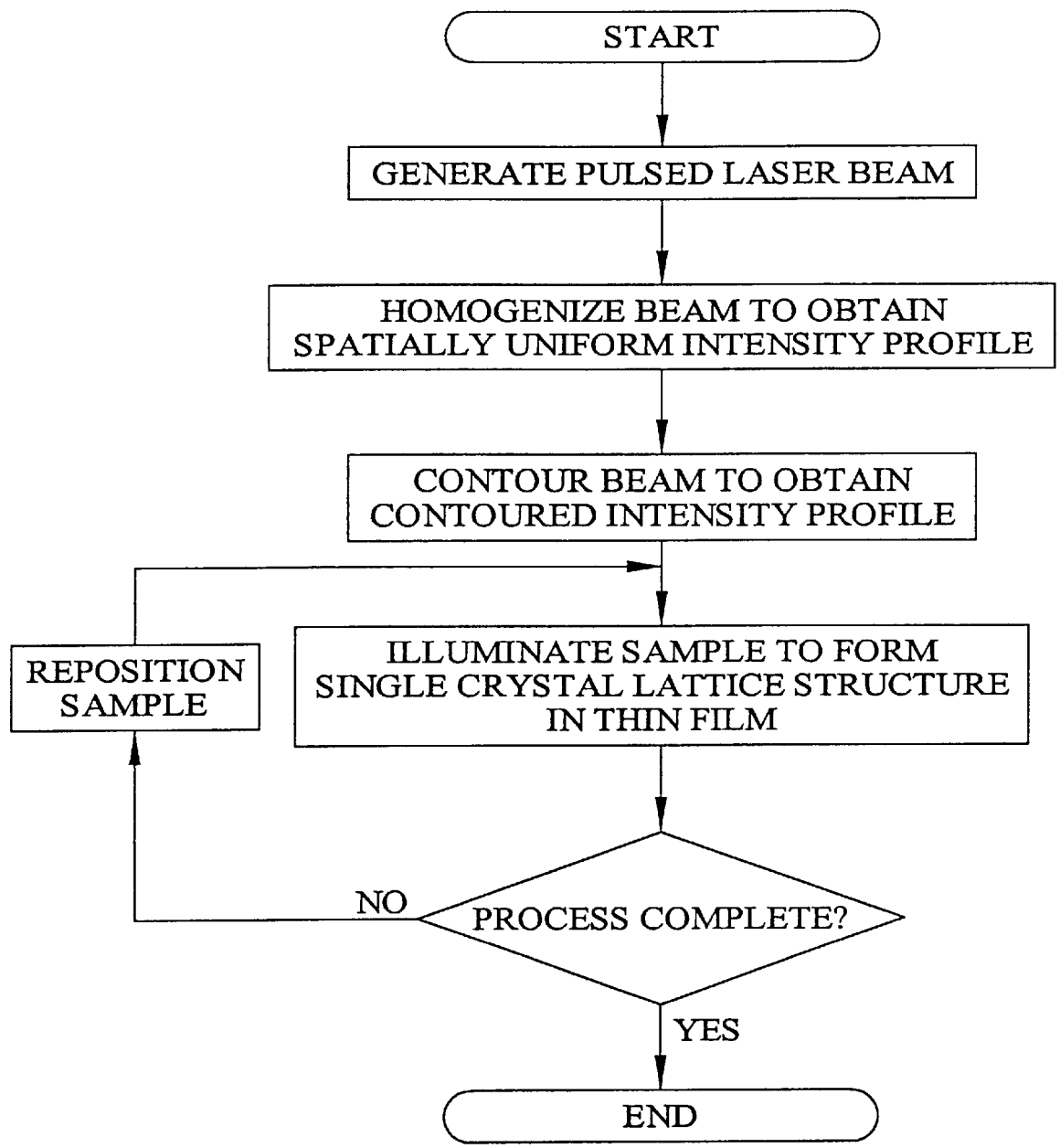
FIG. 4 is a flow chart of an annealing process of the present invention.

In contrast to the scanning technique used in the prior art, the present invention contours the intensity profile of the pulsed laser beam to obtain the favorable conditions for single crystal growth. By repeating the process of contoured pulsed beam illumination followed by repositioning the sample by abutting or overlapping procedures, large areas may be processed without scanning the laser beam. The abutting or overlapping procedures may be omitted to obtain isolated crystallized regions. Scanning the laser beam as taught in the prior art maintains a molten portion that traverses the sample, necessitating a higher thermal budget. In contrast, the contoured intensity profile of the beam of optical energy of the present invention melts and recrystallizes the sample within a time period of about 10 nsec to about 250 nsec. This greatly reduces the thermal budget allowing processing of temperature sensitive substrates, e.g. flexible polyimides and the like. The steps of the improved process of one embodiment of the present invention are shown in the flowchart of FIG. 4. Note that the step of homogenizing the beam of optical energy is optional.

FIG. 5 illustrates the instantaneous structure of a thin film under process somewhat less than 250 nsec after illumination by the pulsed contoured laser beam of the present invention. Note that the angle defined by beam contouring optics is smaller than the included angle defined by the intersection of the preferred crystalline growth planes for producing a single crystal lattice structure in the thin film. The region labeled "IMPROVED THIN FILM" at this instant in time is also molten, but will recrystallize into a single crystal lattice structure along the preferred growth planes.

Alternatively, a supplemental heat source (not shown) may be added to reduce the contoured laser fluence onto sample 312. The supplemental heat source may provide uniform or non-uniform heat by means of conduction, convection, or radiation. Further, repetitive illuminations by the contoured laser beam may be performed with overlapping, abutting, or non-overlapping of the previously illuminated portions to form continuous and isolated single crystal regions in sample 312.

Still another method may be used for reducing the thermal budget when forming improved thin films on temperature sensitive substrates. An improved thin film is first formed on a substrate as described above. The thin film may then be lifted off the substrate and transferred to a temperature sensitive substrate as described, for example, by Yablanovich et al, "Extreme selectivity in the lift-off of epitaxial GaAs films", Applied Physics Letters, 51(26),2222–2224, Dec. 28, 1987.

Other modifications, variations, and applications of the present invention may be made in accordance with the above teachings other than as specifically described to practice the invention within the scope of the following claims.

We claim:

1. A process for crystallizing a thin film on a substrate comprising the steps of:
   transforming the spatially uniform intensity profile of the pulsed optical energy to a contoured intensity profile; and illuminating the thin film with the pulsed optical energy.

2. The process for crystallizing a thin film on a substrate of claim 1 further comprising the step of generating the pulsed optical energy.

3. The process for crystallizing a thin film on a substrate of claim 1 further comprising the step of optically homogenizing a pulsed optical energy to obtain a spatially uniform intensity profile.

4. The process for crystallizing a thin film on a substrate of claim 1 further comprising the step of steering the pulsed optical energy along a surface of the thin film.

5. The process for crystallizing a thin film on a substrate of claim 2 further including the step of imparting a wavelength to the pulsed optical energy in the range of about 157 nm to 351 nm.

6. The process for crystallizing a thin film on a substrate of claim 2 further including the step of imparting a wavelength to the pulse optical energy of about 248 nm.

7. The process for crystallizing a thin film on a substrate of claim 2 further including the step of imparting a pulse duration to the pulsed optical energy in the range of about 10 nsec to 1 msec.

8. The process for crystallizing a thin film on a substrate of claim 2 further including the step of imparting a pulse duration to the pulsed optical energy of about 23 nsec.

9. The process for crystallizing a thin film on a substrate of claim 2 further including the step of imparting a pulse repetition rate to the pulsed optical energy of about 1 Hz.

10. The process for crystallizing a thin film on a substrate of claim 1 further including the step of steering the pulsed optical energy along the surface of the thin film.

11. The process for crystallizing a thin film on a substrate of claim 1 further including the step of supplemental heating to reduce contoured beam fluence onto the thin film.

12. The process for crystallizing a thin film on a substrate of claim 1 wherein the contoured intensity profile is one of linear and non-linear graded intensity profiles.

13. The process for crystallizing a thin film on a substrate of claim 1 wherein the intensity profile has a gradient oriented at an angle with respect to the direction of annealing that favors single crystal growth along preferred growth planes.

14. The process for crystallizing a thin film on a substrate of claim 1 further including repetitive illuminations with at least one of overlapping, abutting, or non-overlapping of previously illuminated portions of the film to form at least one of continuous and isolated crystalline regions.

15. A process for crystallizing a thin film on a substrate comprising the steps of:
   transforming an intensity profile of pulsed optical energy into a contoured intensity profile;
   and illuminating the thin film with the pulsed optical energy to form a crystalline lattice structure.

16. The process for crystallizing a thin film on a substrate of claim 15 wherein the contoured intensity profile is a gradient.

17. The process for crystallizing a thin film on a substrate of claim 16 wherein the gradient is linear.

18. The process for crystallizing a thin film on a substrate of claim 16 wherein the gradient generates a chevron-shaped footprint.

19. The process for crystallizing a thin film on a substrate of claim 17 wherein the gradient generates one side of a chevron-shaped footprint.

* * * * *